United States Patent
Racca et al.

(10) Patent No.: US 11,377,750 B1
(45) Date of Patent: Jul. 5, 2022

(54) DUCTILE COATINGS ON ADDITIVE MANUFACTURED COMPONENTS

(71) Applicant: National Technology & Engineering Solutions of Sandia, LLC, Albuquerque, NM (US)

(72) Inventors: Stephen D. Racca, Allenstown, NH (US); Daniel Paul Gillund, Edgewood, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/014,016

(22) Filed: Sep. 8, 2020

(51) Int. Cl.
*B33Y 40/20* (2020.01)
*C25D 5/10* (2006.01)
*C25D 7/00* (2006.01)
*C25D 3/38* (2006.01)
*C25D 5/50* (2006.01)
*C25D 3/12* (2006.01)
*B33Y 30/00* (2015.01)
*C25D 3/48* (2006.01)
*B33Y 80/00* (2015.01)

(52) U.S. Cl.
CPC ............ *C25D 5/10* (2013.01); *B33Y 30/00* (2014.12); *B33Y 40/20* (2020.01); *C25D 3/12* (2013.01); *C25D 3/38* (2013.01); *C25D 3/48* (2013.01); *C25D 5/50* (2013.01); *C25D 7/00* (2013.01); *B33Y 80/00* (2014.12)

(58) Field of Classification Search
None
See application file for complete search history.

(56) References Cited

U.S. PATENT DOCUMENTS

| | | | |
|---|---|---|---|
| 9,086,033 B2 | 7/2015 | Dushku et al. | |
| 9,782,829 B2 | 10/2017 | Morris et al. | |
| 10,697,253 B2 | 6/2020 | Bartos et al. | |
| 10,751,988 B1 | 8/2020 | Snyder et al. | |
| 2012/0088118 A1* | 4/2012 | Lomasney | C25D 5/18 428/615 |
| 2013/0296998 A1* | 11/2013 | Leotta | G05B 15/02 623/1.11 |
| 2015/0144496 A1* | 5/2015 | Morris | C25F 7/00 205/261 |
| 2016/0341221 A1 | 11/2016 | Twelves, Jr. et al. | |
| 2017/0203511 A1* | 7/2017 | Burkhart | B29C 64/393 |
| 2017/0210063 A1* | 7/2017 | Andres | B29C 66/344 |
| 2017/0333978 A1* | 11/2017 | Slavens | C23C 16/40 |
| 2018/0111315 A1* | 4/2018 | Achten | B33Y 40/00 |
| 2018/0230584 A1* | 8/2018 | Lin | C04B 37/026 |

* cited by examiner

*Primary Examiner* — Wojciech Haske
(74) *Attorney, Agent, or Firm* — Medley, Behrens & Lewis, LLC; Madelynne J. Farber; Mark A. Dodd (57) ABSTRACT

A method of forming a coated component using an additive manufacturing system including building a body portion of the component on a build plate. An outer surface of the body portion can include an indentation resulting from the additive manufacturing system. The method further includes performing at least one post-build process on the body portion. The method yet further includes forming a coating layer on an outer surface of the processed body portion. The coating layer may surround a portion of the body component and may impregnate the indentation. A thickness of the coating layer may be a function of at least one of surface roughness, size of the indentation, or a diameter of particles used to build the additive manufactured bracket.

13 Claims, 7 Drawing Sheets

DUCTILE COATINGS ON ADDITIVE MANUFACTURED COMPONENTS

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Conventionally, metal additive manufacturing systems can be used when the component being built is complex with freeform curves and features. Generally, the system involves arranging powder particles in a thin layer then using a laser to sinter, melt, and fuse the powder particles together while tracing the cross-section for each layer of the component. However, this manufacturing system typically results in a poor surface finish because partially sintered powder, cracks or pores may remain on an outer surface of the built component. These pores and/or cracks on the outer surface reduce the fatigue performance of the component because they introduce structural flaws into the component. As the component is subject to one or more loads these cracks can expand and grow causing the component to fail prematurely. Typically, sandblasting is used to smooth out the high points including some of the cracks and/or pores on the outer surface; however, sandblasting cannot remove all the surface cracks without removing a significant portion of the material and many new components manufactured by additive manufacturing systems have complicated topologically optimized designs that make sandblasting key areas difficult.

SUMMARY

The following is a brief summary of subject matter that is described in greater detail herein. This summary is not intended to be limiting as to the scope of the claims.

In an exemplary embodiment, provided is a procedure for generating a coated component formed via an additive manufacturing system. The procedure can include building a body portion of the component on a build plate. An outer surface of the body portion can include an indentation resulting from the additive manufacturing system. The procedure can further include performing at least one post-build process on the body portion. The at least one post-build process can prepare the body portion to receive a coating layer and/or modify a physical characteristic of the body portion. The procedure may yet further include forming the coating layer on an outer surface of the processed body portion. The coating layer may surround a portion of the processed body component and may impregnate the indentation. A thickness of the coating layer may be a function of diameter of particles used to form the additively manufactured component.

By impregnating the indentation in the outer surface of the body portion, the coating layer can provide a structural connection across the indentation preventing it from growing, thus increasing the fatigue resistance of additive manufactured components. The coating layer can further be configured to increase corrosion resistance and/or electrical conductivity of the component.

The component can take any suitable shape that can be manufactured by additive manufacturing system. For instance, the component may comprise a topology optimized additive manufactured bracket.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to producing a coated additive manufactured component are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details.

In reference to the disclosure herein, for purposes of convenience and clarity only, directional terms, such as, top, bottom, left, right, up, down, upper, lower, over, above, below, beneath, rear, and front, may be used. Such directional terms should not be construed to limit the scope of the features described herein in any manner. It is to be understood that embodiments presented herein are by way of example and not by way of limitation. The intent of the following detailed description, although discussing exemplary embodiments, is to be construed to cover all modifications, alternatives, and equivalents of the embodiments as may fall within the spirit and scope of the features described herein.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something and is not intended to indicate a preference.

Disclosed is a procedure for generating a coated component formed via an additive manufacturing system. Components manufactured via the additive manufacturing system typically include indentations on their outer surfaces that expand under loads, thereby reducing the useful lifetimes of the components. A coating layer is applied to fill in these indentations, providing a structural connection across the indentation and thus preventing further growth of the indentations under loads.

Figure 1:
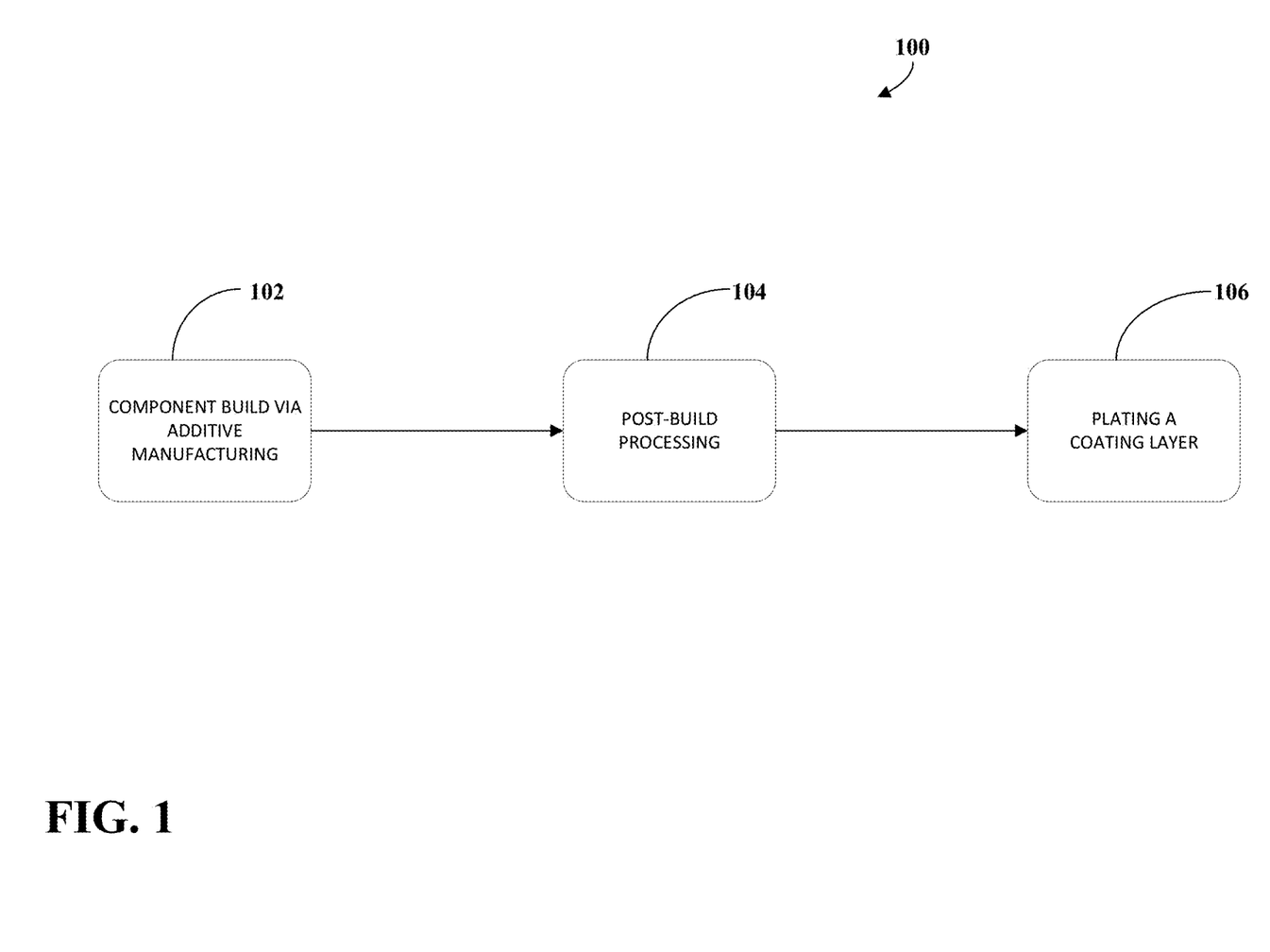
FIG. 1 illustrates an exemplary manufacturing procedure for manufacturing a coated component using an additive manufacturing system.

Turning to FIG. 1, conceptually illustrated is an exemplary manufacturing procedure 100 for manufacturing a coated component using an additive manufacturing system. More particularly, the illustrated manufacturing procedure 100 includes a first step 102 comprising building the component on a build plate via an additive manufacturing system, a second step 104 involving processing the component post building to prepare the component for a coating layer, and a third step 106 comprising applying or plating the coating layer onto the component.

In the first step 102, the additive manufacturing can be performed via any suitable additive manufacturing system. For instance, the additive manufacturing may comprise powder-bed fusion (PBF) which fuses powdered material to additively create or build the three-dimensional component. In the PBF process, a laser or electron beam is used to sinter, melt, and fuse the powder particles together while tracing the cross-section for the object to be created. Exemplary PBF processes can include selective laser sintering (SLS), direct metal laser sintering (DMLS), selective laser melting (SLM), electronic beam melting (EBM), selective heat sintering (SHS), and/or the like. In another example, the additive manufacturing technique may comprise fused deposition modelling (FDM) where a material in a filament form is drawn through a nozzle, heated, and then extruded and deposited onto a build platform in a layer-by-layer process. In a further example, the additive manufacturing technique may comprise vat photopolymerization where a vat filled with the liquid photopolymer resin is exposed to UV light, the geometry of the object to be printed is traced out, and the exposed resin hardens into a solid layer. Other additive manufacturing techniques may be employed in the process 100 such as material jetting, binder jetting, sheet lamination, directed energy deposition, and/or the like.

Subsequent to manufacturing the component via an additive manufacturing system, the component is subject to post-build processing in step 104. The component may be subject to a single post-build process and/or multiple post-build processes in step 104, as will be described in detail below, to prepare the component for receiving the coating layer in step 106.

Subsequent to the post-build processing, a protective coating layer may be formed on an outer surface of the component in step 106. The coating layer may be applied to the entire outer surface of the component or portion(s) thereof. Any suitable technique may be employed for applying the coating to the outer surface of the component. For instance, the coating layer may be formed via sputtering, evaporation, electroless plating, electroplating, chemical displacement reaction, silver mirror reaction, and/or the like. In one embodiment, the coating layer is applied via an electrochemical plating process where a probe is placed on the bracket and a second probe is placed in coating material and the chemical reaction causes the coating material to be deposited on the component. The coating material can be held in a container of any suitable size to submerge the component in the material for the electrochemical plating process. For instance, the container may be four feet by eight feet with a suitable depth, eight feet by eight feet with a suitable depth, and/or the like.

Subsequent to forming the coating layer on the outer surface of the component, the component may be subjected to additional processes that can improve the coating layer on the component. For example, heat treatment may be used to soften a portion of the coating layer such that the coating layer can better fill in the crack(s) on the outer surface of the component through capillary action. In another example, heat treatment may be used to partially and/or fully melt a portion of the coating layer, such that the coating layer can better fill in the crack(s) on the outer surface of the component through capillary action. Better filling of the crack(s) in outer surface of the component can further increase fatigue resistance, electrical conductivity, thermal conductivity, wear resistance, surface finish or smoothness, and/or the like.

Moreover, any suitable coating material may be used for forming the coating layer and may be selected based on an intended use of the component. The coating layer may comprise a single material, a mixture of different material mixed into a single layer, and/or a plurality of different material layers stacked on one another. For instance, the material may be selected based on whether it provides a threshold fatigue resistance for the component. In another example, the material may be selected based on whether it provides a threshold corrosion resistance to the component. In yet another example, the material may be selected based on whether it provides a threshold electrical conductivity to the component.

In one embodiment, the coating material may be inert and may comprise one or more noble metals such as ruthenium, platinum, and/or the like. In another embodiment, the coating layer may comprise gold which may have a threshold purity. In a further embodiment, the coating layer comprises a layer of nickel sandwiched between two layers of gold. In yet another embodiment, the coating layer comprises a layer of copper.

Figure 2:
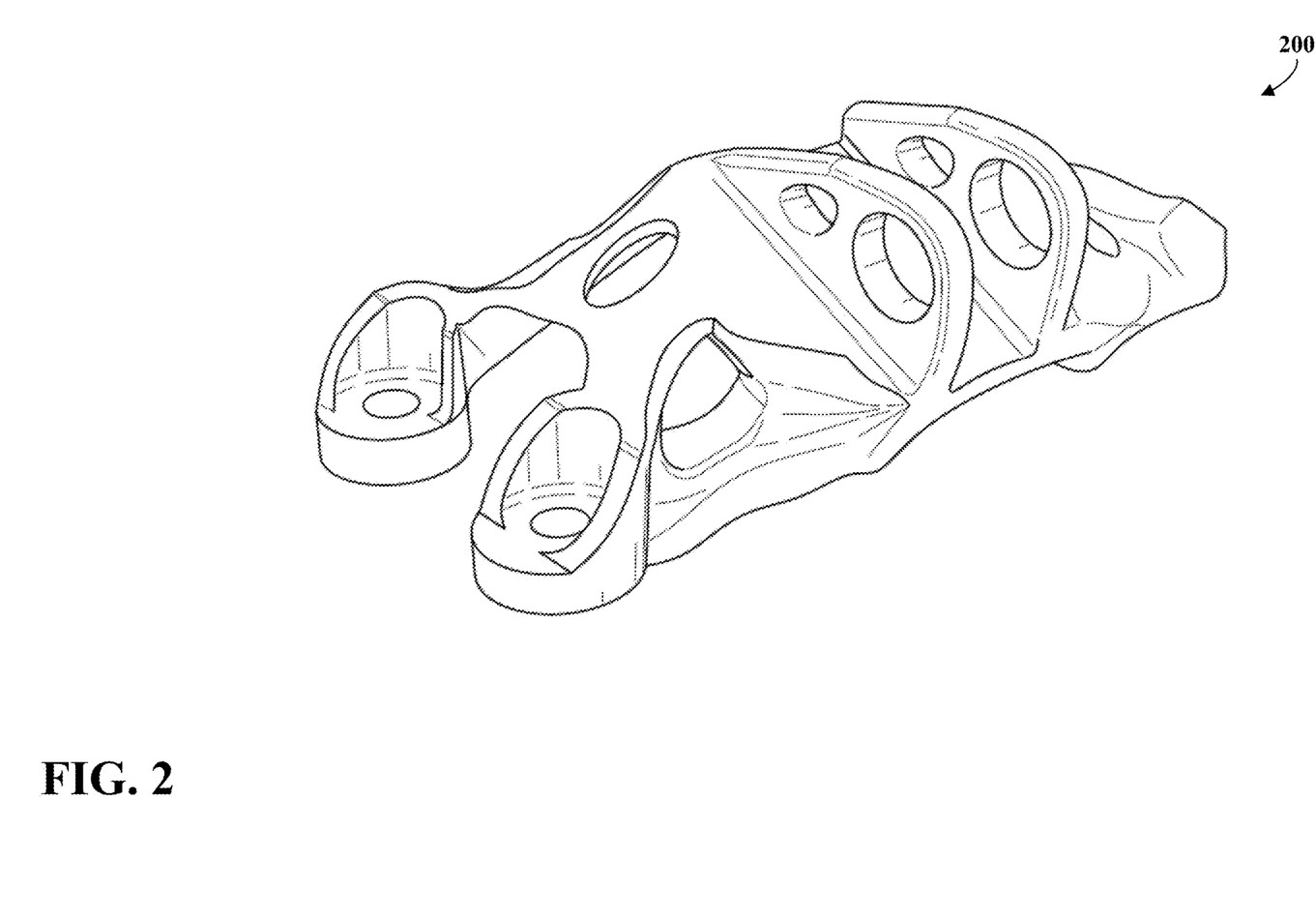
FIG. 2 illustrates an exemplary component manufactured using an additive manufacturing system.

The component can take any suitable shape that can be fabricated via additive manufacturing and that can be coated by the procedure 100. Illustrated in FIG. 2 is one exemplary component comprising a topology optimized additive manufactured bracket 200. As can be seen in FIG. 2, the complicated shape of the additive manufactured bracket 200 can make conventional sandblasting difficult because it is difficult to reach every part of the outer surface to properly sand it.

Figure 3:
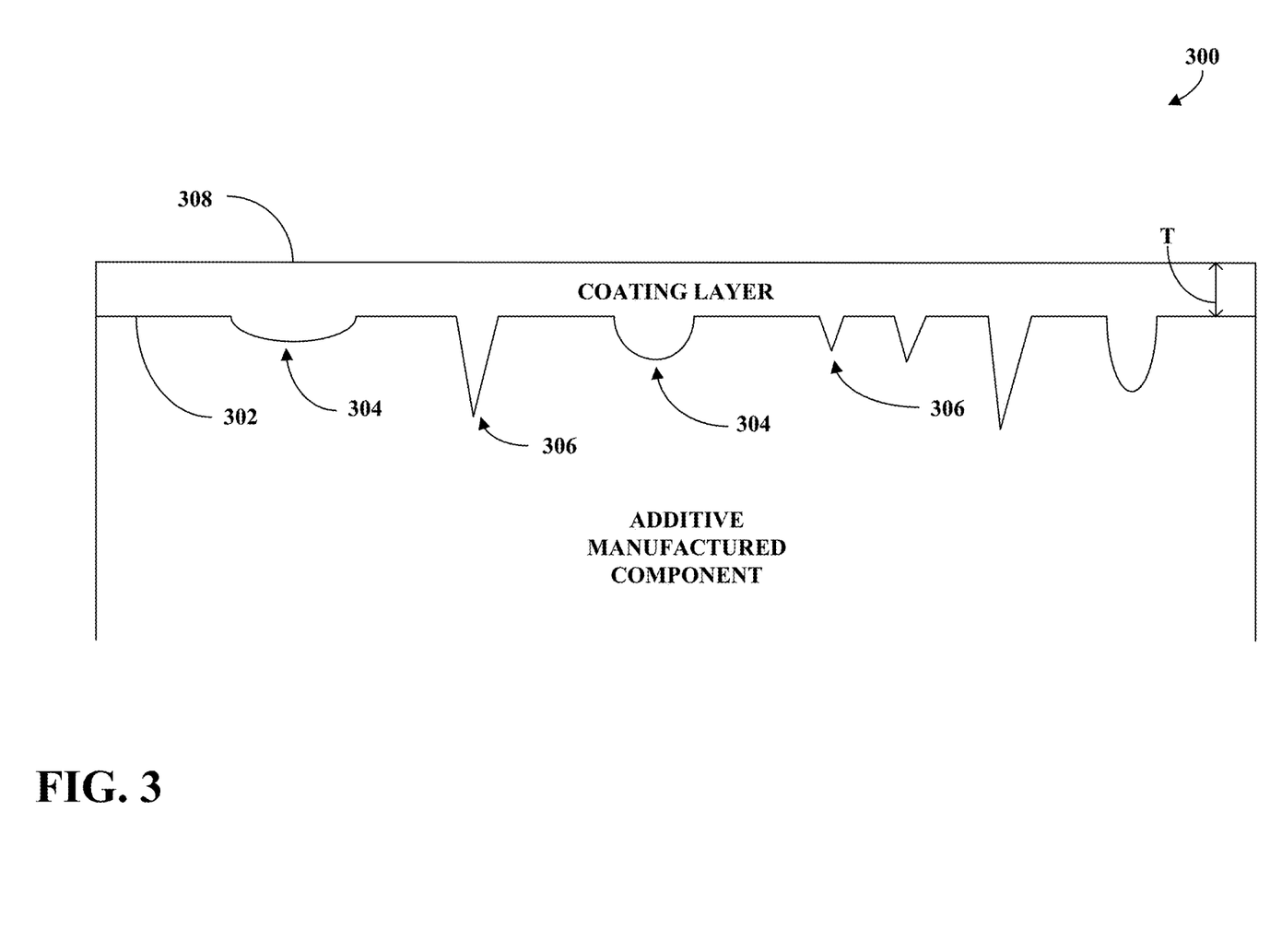
FIG. 3 illustrates a cross-section view of a portion of a coated component.

Turning now to FIG. 3, illustrated is a coated portion 300 of a component. As briefly mentioned above, an outer surface 302 of the component may include defect(s) comprising indentation(s) that are inherent in the additive manufacturing technique. For instance, in the illustrated embodiment, the outer surface 302 includes a plurality of open pores 304 and cracks 306 of varying sizes and depths. In another example, the outer surface 302 may have a so-called "stair casing effect" caused by stacking layers on top of each other to form the final component.

A coating layer 308 is applied to the outer surface 302 in order to protect the outer surface 302 of the component by surrounding and impregnating the indentations (e.g., pores 304 and cracks 306). For instance, the coating layer 308 can fill the crack 306 and provide a structural connection between the walls of the crack 306, to prevent further extension and/or expansion of the crack 306 when the component is subject to loading. By preventing crack growth, the coating layer 308 can increase the useful life of the component. Additionally, selecting an inert material for the coating layer can help prevent corrosion of the component over its lifetime. Moreover, selecting a coating material with a threshold electrical conductivity allows for the component to be directly connected to ground removing the need for extra equipment such as grounding strips.

In order to properly impregnate the indentations, the coating layer 308 is a thickness T on the outer surface 302 that may be based on the coating material(s), the additive manufactured component material(s), and/or the like. For instance, the coating layer thickness T may be a function of a surface roughness value, size of the indentation(s), and/or a diameter of the particles used to form the additive manufactured component. The surface roughness value can be calculated via any suitable method, such as on a profile (e.g., layer by layer, cross-sectional portions thereof, or the like) and/or on a surface. In one embodiment, the thickness T of a gold coating layer is at least 30 microns. Where the coating layer 308 comprises stacked layers of different material (e.g., a nickel layer sandwiched between two gold layers), each of the layers may be similar in thickness or they may vary. For instance, in one embodiment, the coating layer 308 may comprise a nickel coating layer sandwiched between two thinner gold layers.

Figure 4:
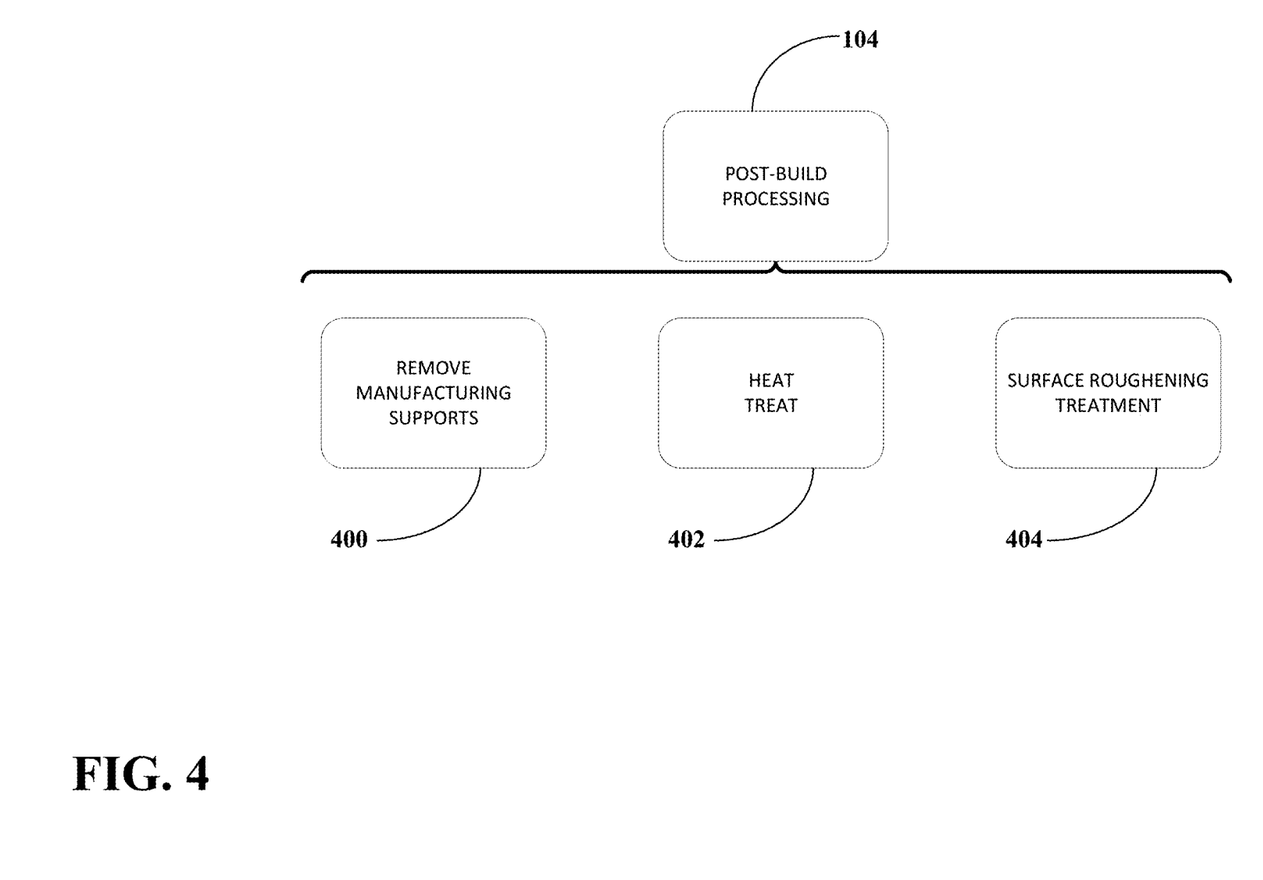
FIG. 4 illustrates exemplary post-build processes.

As briefly mentioned above, in order to prepare the component for the coating layer, the component is subjected to a post-build process(s). This process can include removing extraneous material, strengthening the component, removing one or more indentations, and/or the like. Conceptually illustrated in FIG. 4 are some different post-build processes that can be completed in step 104 of the manufacturing procedure 100. In one post-build process 400, manufacture supports can be removed from the component. These manufacture supports can help prevent component deformation during the building of the component, secure the component to the printing bed, and/or ensure that parts are secured to the main body of built part and should be removed because they are not a part of the final component. In another post-build process 402, the component can be heat treated to improve certain physical characteristics of the component. The heat treatment can be used to release internal tensions accumulated during the building phase and/or increase certain mechanical properties (e.g., strength) of the component. In a further post-build process 404, the component can be subjected to surface roughening treatment configured to smooth the outer surface of the component and/or fill-in/smooth over an indentation in the outer surface. The surface roughening treatments can include sandblasting, manually sanding, etching, and/or the like.

Figure 5:
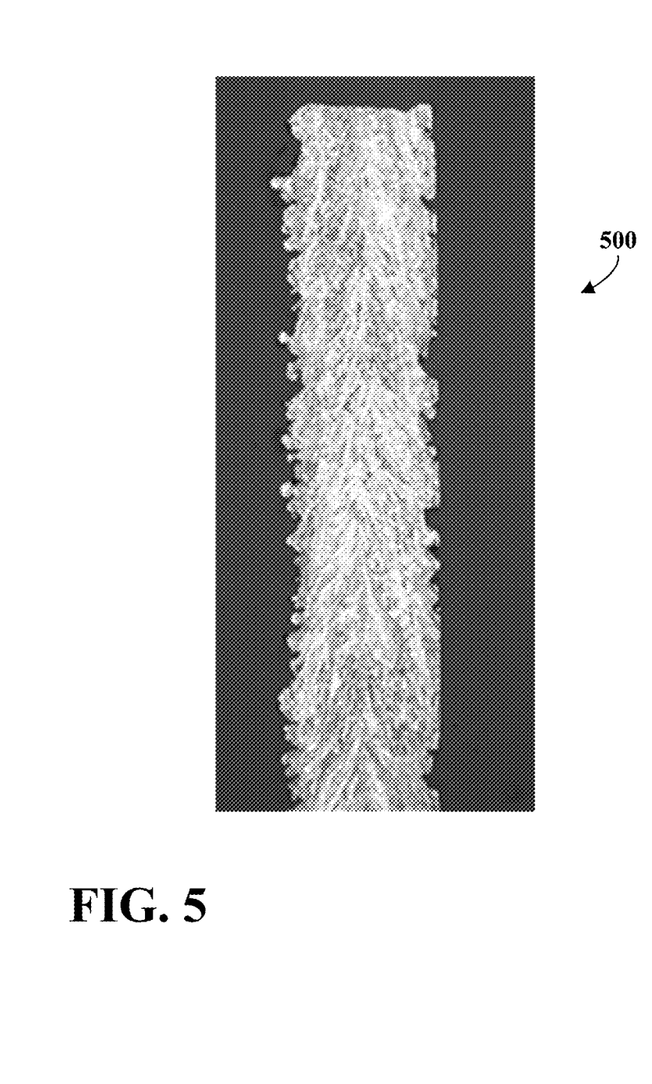
FIG. 5 illustrates a view of an additive manufactured layer.
Figure 6:
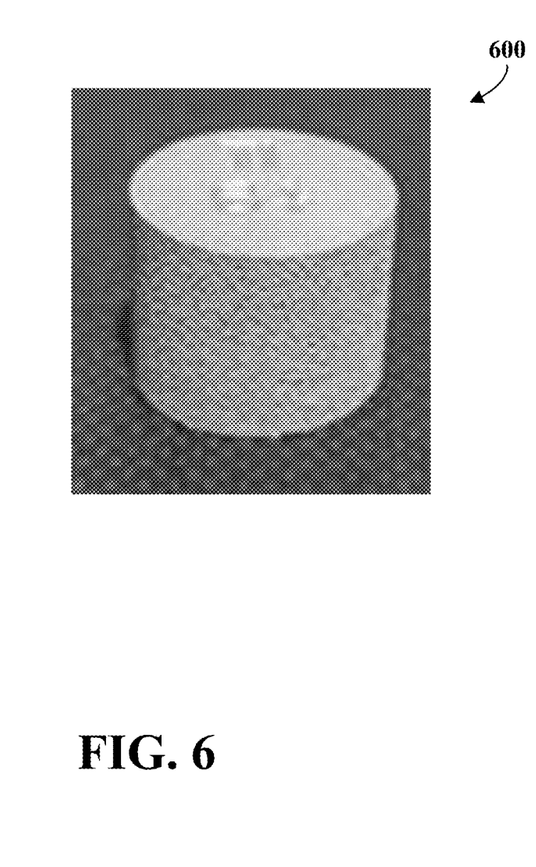
FIG. 6 illustrates an exemplary component manufactured using an additive manufacturing system.
Figure 7:
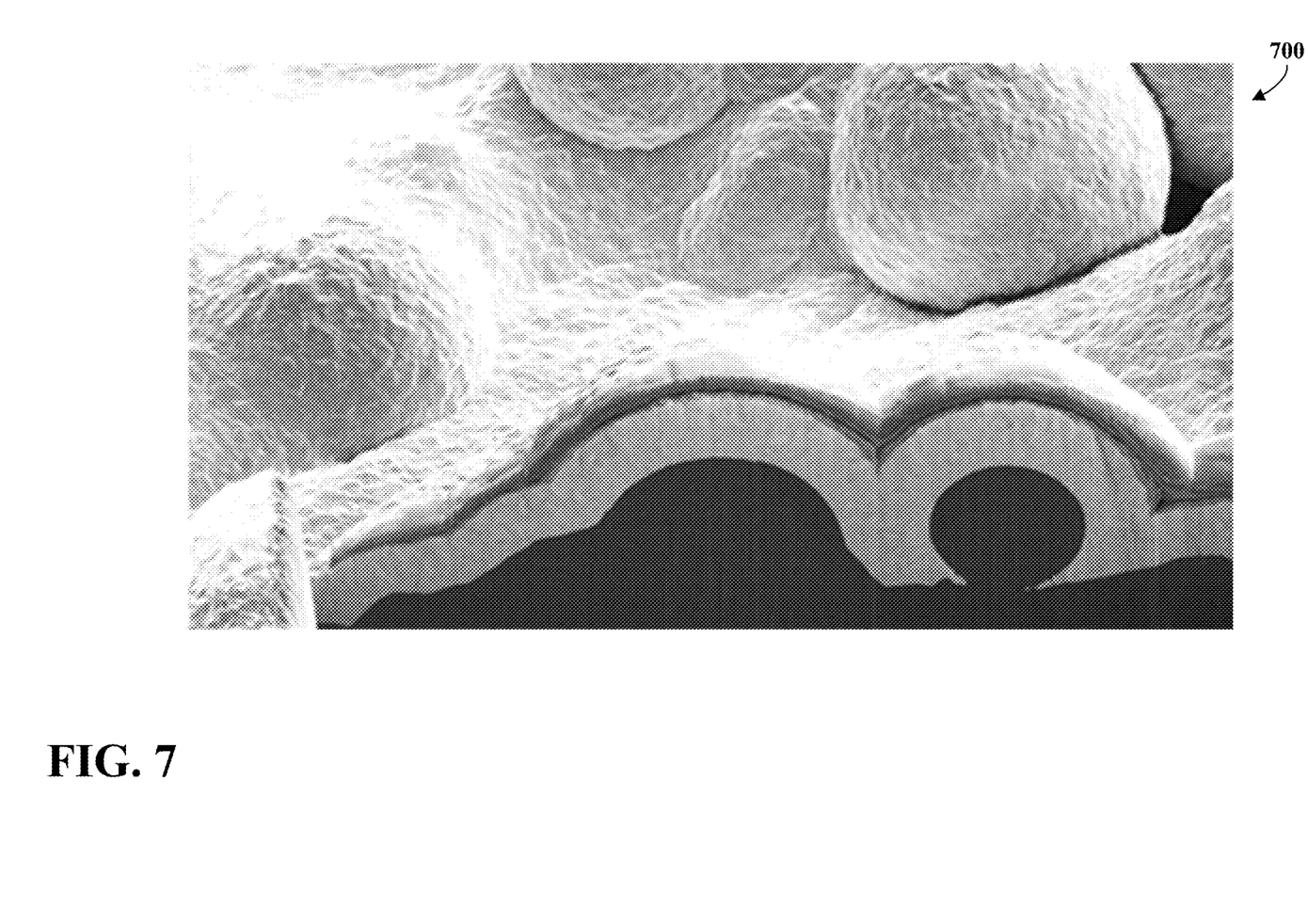
FIG. 7 illustrates a cross-section view of a coated component.

Turning now to FIGS. 5-7, illustrated are further embodiments of products that can be manufactured based on one or more of the above described steps. For example, illustrated in FIG. 5 is a layer 500 of a component formed via an additive manufacturing system. As can be seen in FIG. 5, edges of the layer 500 include one or more indentations. Illustrated in FIG. 6 is another exemplary component 600 manufactured via an additive manufacturing system comprising a cylinder. As shown in FIG. 6, an outer surface of the component 600 includes a plurality of indentations that are the result of additive manufacturing. Turning now to FIG. 7, illustrated is another cross-sectional view of a coated component 700. More particularly, FIG. 7 illustrates a microscopic view of an outer surface of the component and a coating layer(s) attached thereon.

Figure 8:
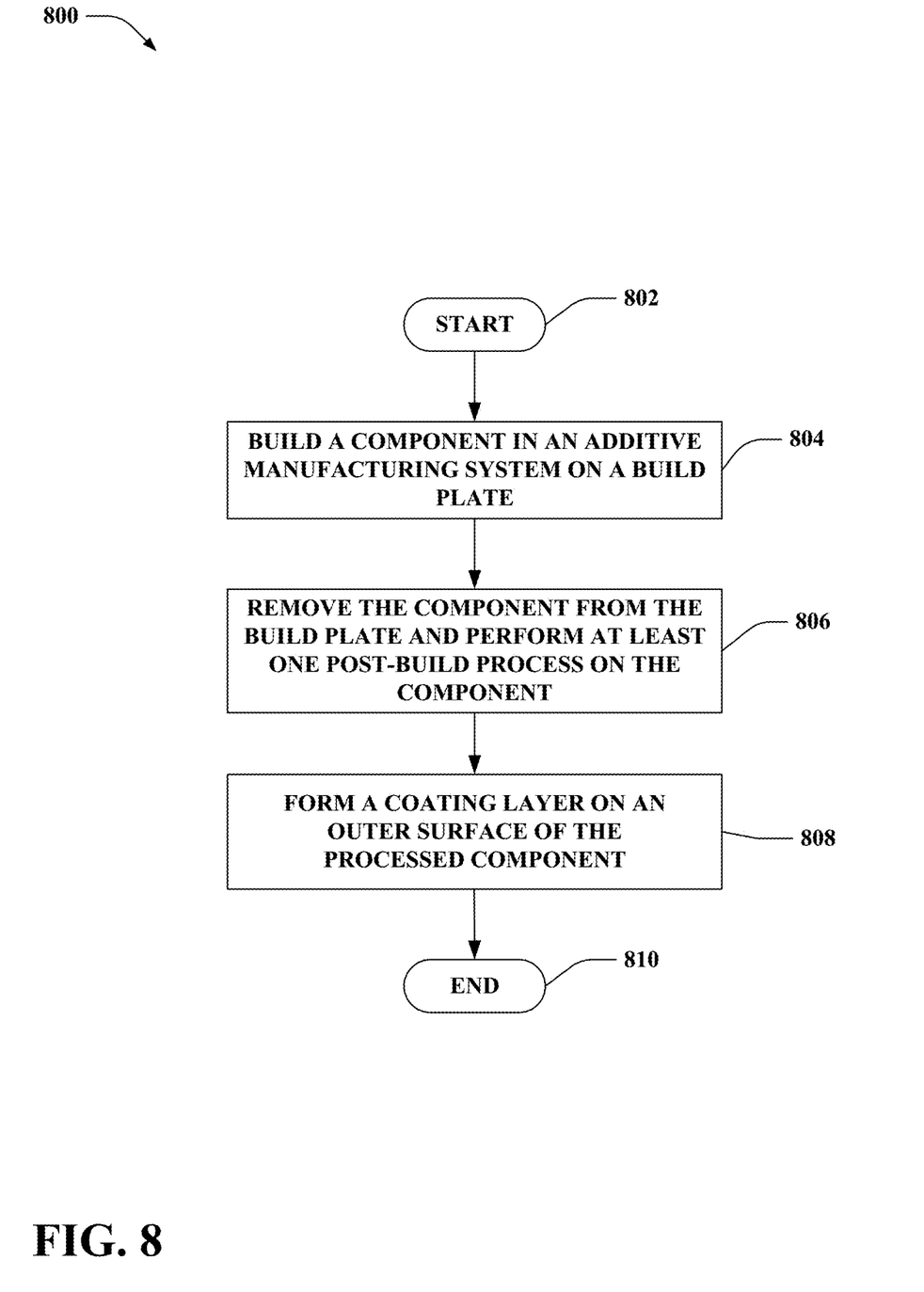
FIG. 8 is a flow diagram that illustrates an exemplary methodology for forming a coated component using an additive manufacturing system.

FIG. 8 illustrates an exemplary methodology relating to forming a coated component using an additive manufacturing system. While the methodology is shown as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Referring now to FIG. 8, an exemplary methodology 800 is illustrated. The methodology 800 starts at 802, and at 804, a body portion of a component is built on a build plate via an additive manufacturing system. An outer surface of the body portion may include an indentation resulting from the additive manufacturing system. At 806, at least one post-build process is performed on the component. The post-build process can include removing the component from the build plate. At 808, a coating layer is formed on an outer surface of the processed component. The coating layer may surround a portion of the body component and impregnate the indentation. A thickness of the coating layer may be a function of a thickness of particles used to form the coating layer. The methodology 800 concludes at 810.

In an embodiment of the methodology 800, forming the coating layer comprises at least one of sputtering, evaporation, electroless plating, electroplating, or chemical displacement reaction.

In another embodiment of the methodology 800, the coating layer comprises a material with at least one of a threshold wear resistance, a threshold corrosion resistance, or a threshold electrical conductivity. In yet another embodiment of the methodology 800, the coating layer comprises a layer of gold. In a further embodiment of the methodology 800, the coating layer comprises a layer of copper. In a yet further embodiment of the methodology 800, the step of forming the coating layer comprises forming a first layer of gold on the outer surface of the processed body portion, forming a layer of nickel on the first layer of gold, and forming a second layer of gold on a face of the layer of nickel opposite the first layer of gold.

In yet another embodiment of the methodology 800, the step of performing at least one post-build process comprises removing manufacturing supports. In another embodiment of the methodology 800, the step of performing at least one-post build process comprises at least one of heat treating the component or performing a surface roughening treatment on the outer surface of the component.

In a further embodiment of the methodology 800, the body portion comprises a topology optimized additive manufactured bracket.

In a yet further embodiment of the methodology 800, subsequent to forming the coating layer on the outer surface of the processed component, heat treating the coated body portion to soften the coating layer to increase impregnation of the indentation.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of forming a coated component using an additive manufacturing system, the method comprising:
    building a body portion of the component on a build plate, wherein an outer surface of the body portion includes an indentation resulting from the additive manufacturing system;
    performing a post-build process on the body portion; and
    subsequent to performing the post-build process on the body portion, forming a coating layer on an outer surface of the body portion, wherein the coating layer surrounds a portion of the body portion and impregnates the indentation, wherein impregnating the indentation fills the indentation with the coating layer, wherein a thickness of the coating layer is selected based on at least one of a surface roughness value, size of the indentation, or a diameter of particles used to build the body portion, and wherein forming the coating layer comprises at least one of sputtering, evaporation, electroless plating, electroplating, or chemical displacement reaction.

2. The method of claim 1, wherein the coating layer comprises a material selected based on at least one of a fatigue resistance, a corrosion resistance, or an electrical conductivity.

3. The method of claim 1, wherein the coating layer comprises at least one of a layer of gold or a layer of copper.

4. The method of claim 1, wherein forming the coating layer comprises:
    forming a first layer of gold on the outer surface of the processed body portion;
    forming a layer of nickel on the first layer of gold; and
    forming a second layer of gold on a face of the layer of nickel opposite the first layer of gold.

5. The method of claim 1, further comprising:
    subsequent to forming the coating layer, heat treating the coated body portion to soften the coating layer to increase impregnation of the indentation.

6. The method of claim 1, wherein performing at least one post-build process on the body portion comprises removing manufacturing supports.

7. The method of claim 1, wherein performing at least one post-build process comprises at least one of:
    heat treating the body portion; or
    performing a surface roughening treatment on the outer surface of the body portion.

8. The method of claim 1, wherein the body portion comprises an additive manufactured bracket.

9. A method of forming a coated component using an additive manufacturing system, the method comprising:
    building an additive manufactured bracket on a build plate, wherein an outer surface of the additive manufactured bracket includes an indentation resulting from additively manufacturing the bracket;
    performing a post-build process on the additive manufactured bracket; and
    subsequent to performing the post-build process on the additive manufactured bracket, forming a coating layer on an outer surface of the additive manufactured bracket, wherein the coating layer surrounds a portion of the additive manufactured bracket and impregnates the indentation, wherein impregnating the indentation fills the indentation with the coating layer, wherein a thickness of the coating layer is selected based on at least one of a surface roughness value, size of the indentation, or a diameter of particles used to build the additive manufactured bracket, and wherein forming the coating layer comprises at least one of sputtering, evaporation, electroless plating, electroplating, or chemical displacement reaction.

10. The method of claim 9, wherein the coating layer comprises a material selected based on at least one of a wear resistance, a corrosion resistance, or an electrical conductivity.

11. The method of claim 9, wherein the coating layer comprises at least one of a layer of gold or a layer of copper.

12. The method of claim 9, wherein forming the coating layer comprises:
    forming a first layer of gold on the outer surface of the processed additive manufactured bracket;
    forming a layer of nickel on the first layer of gold; and
    forming a second layer of gold on a face of the layer of nickel opposite the first layer of gold.

13. The method of claim 9, further comprising:
    subsequent to forming the coating layer, heat treating the coated body portion to soften the coating layer to increase impregnation of the indentation.

* * * * *